(12) United States Patent
Khine et al.

(10) Patent No.: US 9,172,351 B2
(45) Date of Patent: Oct. 27, 2015

(54) PIEZOELECTRIC RESONATOR HAVING ELECTRODE FINGERS WITH ELECTRODE PATCHES

(75) Inventors: Lynn Khine, Singapore (SG); Ming Lin Julius Tsai, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 237 days.

(21) Appl. No.: 13/883,475

(22) PCT Filed: Nov. 2, 2011

(86) PCT No.: PCT/SG2011/000388
§ 371 (c)(1),
(2), (4) Date: Jul. 15, 2013

(87) PCT Pub. No.: WO2012/064283
PCT Pub. Date: May 18, 2012

(65) Prior Publication Data
US 2013/0300521 A1    Nov. 14, 2013

(30) Foreign Application Priority Data
Nov. 8, 2010    (SG) ................. 201008262-6

(51) Int. Cl.
*H03H 9/13* (2006.01)
*H03H 9/54* (2006.01)
*H03H 9/64* (2006.01)
*H03H 9/02* (2006.01)

(52) U.S. Cl.
CPC ........... *H03H 9/132* (2013.01); *H03H 9/02228* (2013.01); *H03H 9/54* (2013.01); *H03H 9/64* (2013.01)

(58) Field of Classification Search
CPC ... H03H 9/132; H03H 9/02228; H03H 9/145; H03H 9/14544; H03H 9/1457; H03H 9/02881; H03H 9/54; H03H 9/64

USPC .......... 333/187, 189, 181, 192, 193; 310/313 B, 365, 366
See application file for complete search history.

(56) References Cited

U.S. PATENT DOCUMENTS

| | | | |
|---|---|---|---|
| 5,031,920 A | 7/1991 | Poirier | |
| 5,363,073 A | 11/1994 | Higgins | |
| 6,295,247 B1 | 9/2001 | Khuri-Yakub et al. | |
| 6,791,236 B1 * | 9/2004 | Abramov | ........... 310/313 B |

(Continued)

FOREIGN PATENT DOCUMENTS

JP    2004140761    5/2004

OTHER PUBLICATIONS

Khine et al.; "Piezoelectric AlN MEMS Resonators With High Coupling Coefficient"; (IEEE 2011) Transducers'11, Beijing, China, Jun. 5-9, 2011, pp. 526-529.*

(Continued)

*Primary Examiner* — Barbara Summons
(74) *Attorney, Agent, or Firm* — K. David Crockett, Esq.; Niky Economy Syrengelas, Esq.; Crockett & Crockett, PC

(57) ABSTRACT

According to embodiments of the present invention, a piezoelectric resonator is provided. The piezoelectric resonator includes a piezoelectric substrate, a first electrode comprising a first plurality of electrode fingers, a second electrode comprising a second plurality of electrode fingers, wherein the first plurality of electrode fingers and the second plurality of electrode fingers are interdigitated, and wherein electrode patches are arranged along the first plurality of electrode fingers and the second plurality of electrode fingers according to a 2-dimensional lattice.

15 Claims, 12 Drawing Sheets

(56) References Cited

U.S. PATENT DOCUMENTS

| | | |
|---|---|---|
| 6,885,705 B2 | 4/2005 | Arita et al. |
| 6,909,221 B2 | 6/2005 | Ayazi et al. |
| 7,099,393 B2 | 8/2006 | Arita et al. |
| 7,133,453 B2 | 11/2006 | Arita et al. |
| 7,486,430 B2 | 2/2009 | Gan et al. |
| 7,492,241 B2 | 2/2009 | Piazza et al. |
| 7,528,685 B2 | 5/2009 | Tanaka |
| 7,535,152 B2 | 5/2009 | Ogami et al. |
| 7,728,483 B2 | 6/2010 | Tanaka |
| 2002/0030420 A1* | 3/2002 | Tsukai et al. ............ 310/320 |
| 2002/0043888 A1* | 4/2002 | Aigner et al. ........ 310/313 B |

OTHER PUBLICATIONS

Stephanou et al.; "Mechanically Coupled Contour Mode Piezoelectric Aluminum Nitride MEMS Filters"; (IEEE 2006) MEMS 2006, Istanbul, Turkey, Jan. 22-26, 2006, pp. 906-909.*

Adler, et al., Plate Modes in Piezoelectric Multilayered Structures, Revue Physical Application, vol. 20, No. 6, Jun. 1985, pp. 311-317.

Piazza, et al., Piezoelectric Aluminum Nitride Vibrating Contour-Mode MEMS Resonators, Journal of Microelectromechanical Systems, vol. 15, No. 6, Dec. 2006, pp. 1406-1418.

Kuypers, et al., Intrisic Temperature Compensation of Aluminum Nitride Lamb Wave Resonators for Multiple-Frequency References, IEEE Inter. Freq. Control Symp. (IEEE 2008), pp. 240-249.

Yantchev, et al., Micromachined Thin Film Plate Acoustic Resonators Utilizing the Lowest Order Symmetric Lamb Wave Mode, IEEE Transactions on Ultrasonics, Ferroelectrics, and Frequency Control, vol. 54, No. 1, Jan. 2007, pp. 87-95.

Rinaldi, et al., 5-10 GHz AlN Contour-Mode Nanoelectromechanical Resonators, IEEE International Conference on Micro Electro Mechanical Systems (MEMS 2009), Jan. 25-29, 2009, pp. 916-919.

* cited by examiner

… (US 9,172,351 B2)

PIEZOELECTRIC RESONATOR HAVING ELECTRODE FINGERS WITH ELECTRODE PATCHES

CROSS-REFERENCE TO RELATED APPLICATION

This application claims the benefit of priority of Singapore patent application No. 201008262-6, filed 8 Nov. 2010, the content of it being hereby incorporated by reference in its entirety for all purposes.

TECHNICAL FIELD

Various embodiments relate to a piezoelectric resonator.

BACKGROUND

The present technology for piezoelectric resonators requires excitation of resonant vibration mode that usually involves some form of acoustic wave coupling. Almost all the piezoelectric resonators can be categorized as Surface Acoustic Wave (SAW) and Bulk Acoustic Wave (BAW) resonators. Two important parameters for MEMS resonators are quality factor electrical-to-mechanical coupling coefficient for RF filters. It is desirable to have high quality factor for oscillator applications and high coupling coefficient for filters.

The existing piezoelectric resonators with periodic inter-digitated fingers—such as contour-mode, extensional-mode, and piezo-on-substrate resonators—excite longitudinal plate acoustic waves along one dimension. Plate-wave resonators with periodic electrodes are prone to excite other spurious modes and careful design is required in order to suppress these undesirable modes. One of the short-comings of plate-wave contour-mode resonators is insufficient piezoelectric coupling coefficient in order to build band-pass filters with large enough bandwidth for today's RF communications.

SUMMARY

According to an embodiment, a piezoelectric resonator is provided. The piezoelectric resonator may include a piezoelectric substrate, a first electrode comprising a first plurality of electrode fingers, a second electrode comprising a second plurality of electrode fingers, wherein the first plurality of electrode fingers and the second plurality of electrode fingers are interdigitated, and wherein electrode patches are arranged along the first plurality of electrode fingers and the second plurality of electrode fingers according to a 2-dimensional lattice.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" or "approximately" as applied to a numeric value encompasses the exact value and a variance of +/−5% of the value.

Various embodiments relate to the field of Micro-Electro-Mechanical Systems (MEMS) technology, and in particular the development of piezoelectric resonators with acoustic wave propagation within a structural material. Various embodiments may provide piezoelectric micromechanical resonators, e.g. thin-film piezoelectric micromechanical resonators, for applications such as sensors, actuators, RF-MEMS oscillators and filters. The resonators may have a large operation frequency range from MHz to GHz. Various embodiments may enable two-dimensional excitation of plate acoustic waves, highly selective resonance mode of two-dimensional acoustic wave excitation, as well as specific excitation to suppress spurious modes.

The types of acoustic waves that may be excited within a thin plate are Lamb waves and shear waves that have their own characteristic acoustic velocity excited at a certain wavelength ($\lambda$). The length and width of the plate are larger than the wavelength. The thickness (h) of the plate may be a few wavelengths or may be as small as a fraction of the wavelength.

Lamb waves are a type of plate acoustic waves that propagate parallel to the device surface within the structural material. The two fundamental modes of Lamb waves are the asymmetric and symmetric modes, i.e. asymmetric Lamb waves and symmetric Lamb waves.

Figure 1:
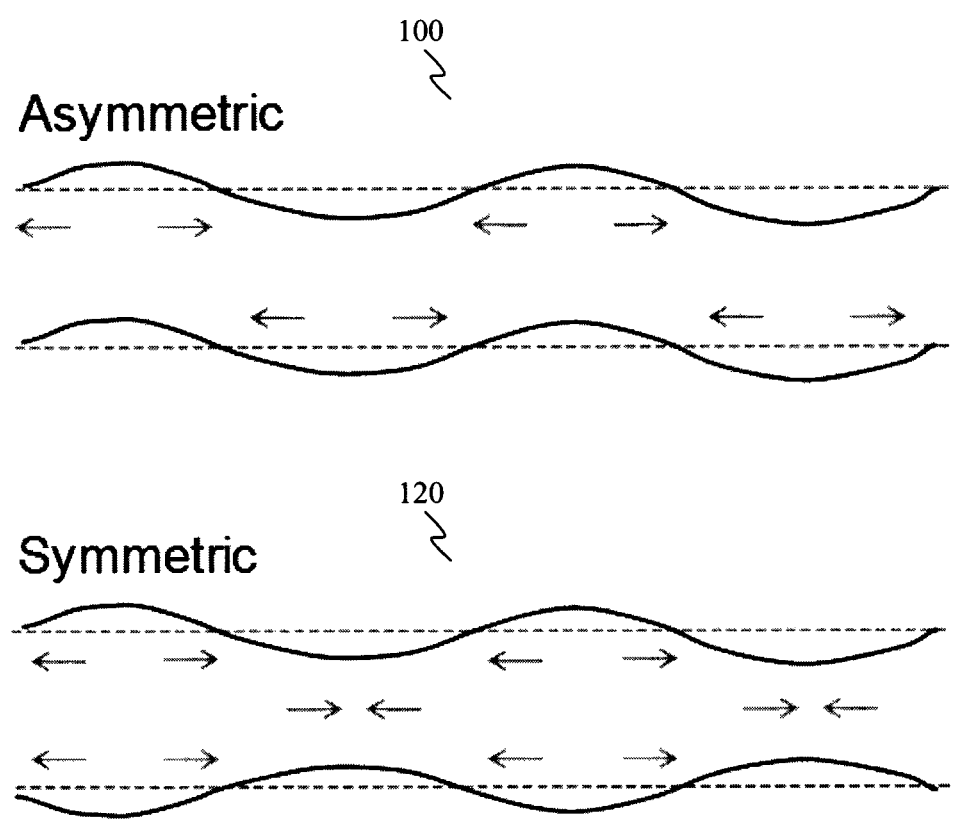
FIG. 1 shows the asymmetric and symmetric Lamb waves.

FIG. 1 shows the asymmetric Lamb waves 100 and the symmetric Lamb waves 120. The asymmetric Lamb waves 100 or modes are observed to have an average displacement in the transverse direction and these modes are also termed as flexural modes. In asymmetric mode, the body of the plate bends as the two surfaces move in the same direction. The Lamb waves 120 of symmetric mode move in a symmetrical manner about the median plane of the plate where the waves stretch and compress the plate in extensional shape. The symmetric waves 120 are also called longitudinal waves because the average displacement over the thickness of the plate is in the longitudinal direction.

Plate acoustic waves such as Lamb waves within a piezoelectric layer may be excited and sensed using interdigitated (IDT) electrode fingers, for example placed over or on top of the piezoelectric layer or on both the top and bottom of the piezoelectric layer.

There may be extensional-mode and contour-mode acoustic wave excitations within the piezoelectric material of piezoelectric resonators, e.g. aluminium nitride (AlN) piezoelectric resonators. Higher-order extensional mode or contour mode resonator may be present, which are parallel cascading effect of small individual extensional-mode sections. The displacement for extensional/contour mode resonators is caused by the applied electric field perpendicular to the surface. The electric field induces extension/contraction due to the resulting piezoelectric strain ($d_{31}$ coefficient). At resonance, the minimum displacement happens at the electrode centre and maximum displacement occurs in between the electrodes with opposite polarity due to the nature of vibration for extensional/contour-mode resonators that are based on longitudinal (extensional) acoustic wave vibrations.

By using IDTs, Lamb wave resonators with multiple frequencies from tens of MHz to 10 GHz may be designed on a single wafer. Unlike the Surface Acoustic Waves (SAW) that travel along the surface of a material, Lamb waves deform the entire plate and travel within the substrate or structural layer. In addition, SAW wave amplitudes typically decay exponentially with the depth into the substrate. Moreover, the acoustic phase velocity of both symmetric and asymmetric Lamb waves depend on the ratio of the thickness of the plate to the wavelength ($h/\lambda$). At resonance, the amplitude of displacement for Lamb wave resonators is the largest at the electrode centre (e.g. electrode width of $\lambda/4$) of both positive and negative polarities. Although Lamb waves may be electrically excited on any type of piezoelectric material, the use of AlN offers ease of fabrication and its compatibility with CMOS. Lamb wave resonators may be used in such diverse applications as oscillators, filters, sensors and actuators.

Various embodiments provide piezoelectric resonators with checker-patterned electrodes or checker-patterned electrode architecture for electrical excitation of the piezoelectric material. Such an architecture may improve the performance of resonators. The checker-patterned electrodes may simultaneously excite two intersecting acoustic waves (e.g. asymmetric or symmetric Lamb waves), for example one wave travelling along an X direction and the other wave travelling along a Y direction within a horizontal plane. In addition, the checker-patterned electrodes may enable two-dimensional excitation of acoustic resonant modes such as extensional mode or contour mode, as well as extensional bulk waves in silicon-on-insulator (SOI).

In various embodiments, the two intersecting waves may be in a symmetric mode (i.e. symmetric waves) or in an asymmetric mode (i.e. asymmetric waves), depending on the excitation source and the thickness of the resonator/device layers and resonator/device design. Excitation of asymmetric mode or symmetric mode may be achieved by changing the AC source to the resonant frequency of the desired mode. The symmetric mode is at a higher frequency compared to the asymmetric mode as the acoustic velocity of the symmetric mode is higher.

In various embodiments, the checker-patterned electrodes are positioned or formed on a thin piezoelectric film or substrate and the checker-patterned electrodes may excite plate acoustic waves such as Lamb waves that propagate in symmetric or asymmetric displacements within the piezoelectric substrate.

Various embodiments may provide a piezoelectric resonator with a metal electrode formed over or on top of a piezoelectric layer or substrate. The top metal electrode or electrode layer may be patterned to form a pair of interdigitated electrode fingers. Each electrode finger includes electrode patches arranged along the finger. Therefore, various embodiments may provide respective pairs of interdigitated checker-patterned electrode fingers.

Various embodiments may provide a piezoelectric resonator with two metal electrodes formed over opposite sides of a piezoelectric layer or substrate, i.e. the piezoelectric layer is between two metal electrodes (e.g. between a top metal electrode and a bottom metal electrode). The top metal electrode may be patterned to form a pair of interdigitated electrode fingers or each of the top and bottom metal electrodes may be patterned to form a respective pair of interdigitated electrode fingers. Each electrode finger includes electrode patches arranged along the finger, thereby forming pairs of interdigitated checker-patterned electrode fingers.

In various embodiments, the resonant frequencies of the resonators may be changed by changing the geometry of the electrode layer, for example by varying or adjusting the size of the electrode patches and/or the distance or pitch between the electrode patches, e.g. between adjacent electrode patches, thereby changing the wavelength of acoustic excitation. Therefore, resonators with multiple frequencies may be fabricated on a single wafer, for example for oscillators and filters. In addition, multiple resonant frequencies may be generated or provided along two directions (e.g. X and Y directions) within a horizontal plane.

Where an electric field is applied across adjacent electrode fingers or electrode patches of an electrode layer (e.g. the top metal electrode) to excite the resonator, the resonator is under lateral field excitation (LFE).

Where an electric field is applied across the top and bottom electrodes (e.g. across the electrode patches of the top and bottom electrodes) to excite the resonator, the resonator is under thickness field excitation (TFE). In various embodiments, either of TFE or LFE or both types of excitation may be employed to excite the checker-mode.

In the context of various embodiments, the term "checker-mode" means the mode of resonance excited by the checker electrodes or checker-patterned electrodes, of various embodiments, where two intersecting acoustic waves within piezoelectric material are simultaneously excited, for example one wave travelling along an X direction and the other wave travelling along a Y direction within a horizontal plane. In other words, the two simultaneously excited waves travel in directions perpendicular to each other.

In the context of various embodiments, resonators or piezoelectric resonators incorporating the checker electrodes or checker-patterned electrodes are known as "checker-mode resonators".

In order that the invention may be readily understood and put into practical effect, particular embodiments will now be described by way of examples and not limitations, and with reference to the figures.

Figure 2A:
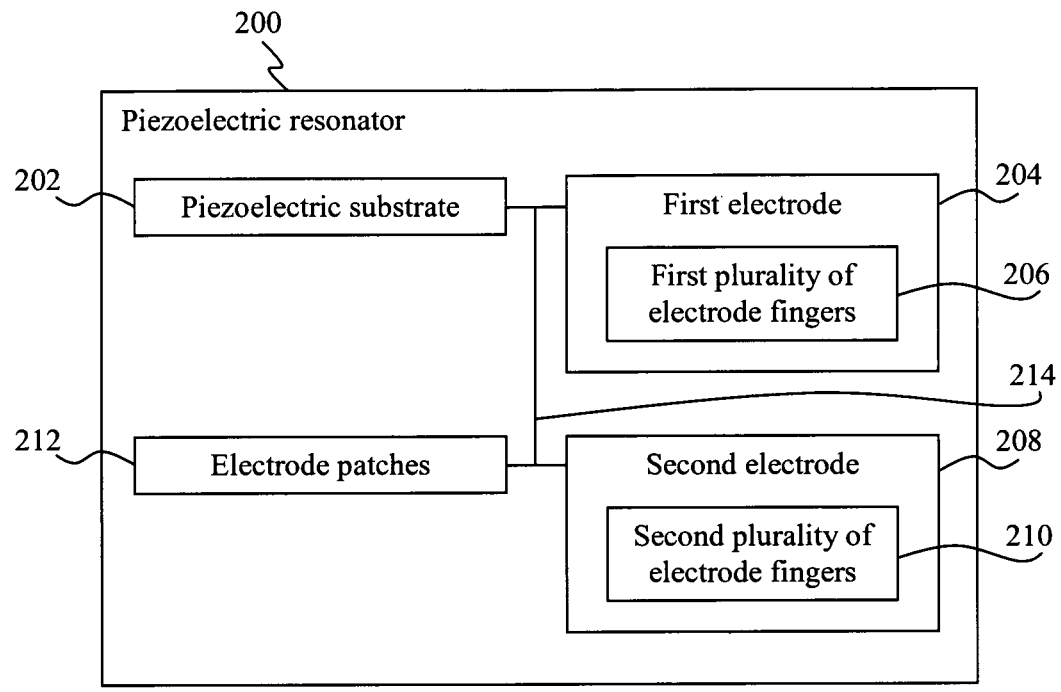
FIGS. 2A to 2D show respectively a schematic block diagram of a piezoelectric resonator, according to various embodiments.

FIG. 2A shows a schematic block diagram of a piezoelectric resonator 200, according to various embodiments. The piezoelectric resonator 200 includes a piezoelectric substrate 202, a first electrode 204 comprising a first plurality of electrode fingers 206, a second electrode 208 comprising a second plurality of electrode fingers 210, wherein the first plurality of electrode fingers 206 and the second plurality of electrode fingers 210 are interdigitated, and wherein electrode patches 212 are arranged along the first plurality of electrode fingers 206 and the second plurality of electrode fingers 210 according to a 2-dimensional lattice. The line represented as 214 is illustrated to show the relationship between the different elements, which may include electrical coupling and/or mechanical coupling.

The electrode patches 212 may be arranged according to a line grid which comprises a first plurality of lines and a second plurality of lines, the first plurality of lines and the second plurality of lines extending along a first dimension. The electrode patches 212 arranged along the first plurality of electrode fingers may be arranged along the first plurality of lines, and the electrode patches arranged along the second plurality of electrode fingers may be arranged along the second plurality of lines.

In various embodiments, the first plurality of electrode fingers 206 and the second plurality of electrode fingers 210 may extend along a second dimension that is perpendicular to the first dimension.

The first plurality of lines and the second plurality of lines may be arranged in an alternating manner along the second dimension. The lines of the first plurality of lines and the second plurality of lines may be at least substantially equally spaced along the second dimension.

In various embodiments, the first electrode 204 and the second electrode 208 may be disposed over a first surface of the piezoelectric substrate 202.

Therefore, according to one embodiment, two electrodes are provided, where each electrode has a plurality of electrode fingers. The electrodes are arranged in an interdigitated manner such that the electrode fingers of the two electrodes are arranged alternately. In other words, an electrode finger of an electrode is arranged in between two electrode fingers of the other electrode.

In addition, electrode patches are arranged along the electrode fingers of the two electrodes, where the electrode patches arranged along an electrode finger are arranged spaced apart. The electrode patches arranged along the electrode fingers of one electrode are arranged diagonally relative to the electrode patches arranged along the electrode fingers of the other electrode.

Figure 2B:
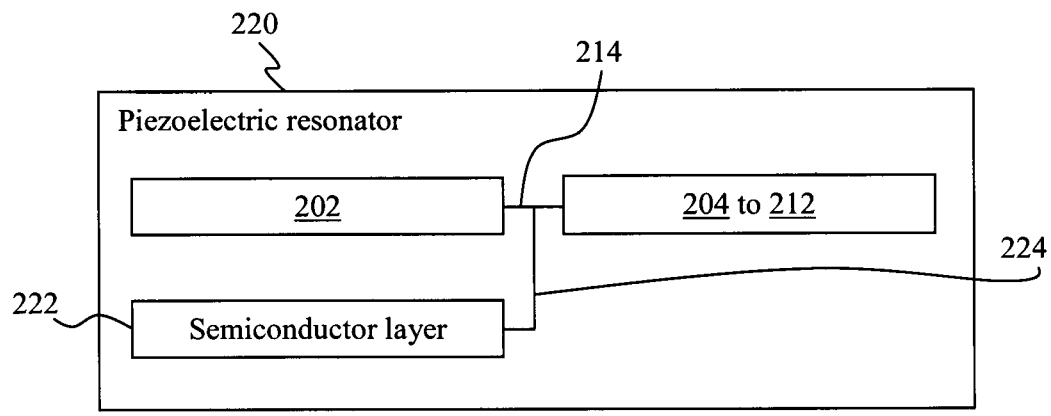

FIG. 2B shows a schematic block diagram of a piezoelectric resonator 220, according to various embodiments. The piezoelectric resonator 220 includes a piezoelectric substrate 202, a first electrode 204, a second electrode 208 and electrode patches 212, which may be similar to the embodiment as described in the context of FIG. 2A. The piezoelectric resonator 220 may further include a semiconductor layer 222 disposed over a second surface of the piezoelectric substrate 202. The line represented as 224 is illustrated to show the relationship between the different elements, which may include electrical coupling and/or mechanical coupling.

Figure 2C:
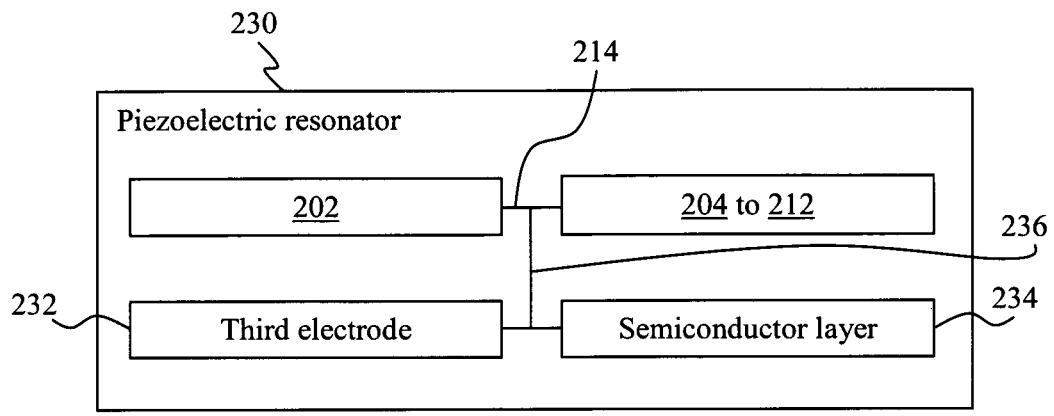

FIG. 2C shows a schematic block diagram of a piezoelectric resonator 230, according to various embodiments. The piezoelectric resonator 230 includes a piezoelectric substrate 202, a first electrode 204, a second electrode 208 and electrode patches 212, which may be similar to the embodiment as described in the context of FIG. 2A.

The piezoelectric resonator 230 may further include a third electrode 232 disposed over a second surface of the piezoelectric substrate 202. The third electrode 232 may be a contiguous electrode layer covering the second surface of the piezoelectric substrate 202.

The piezoelectric resonator 230 may further include a semiconductor layer 234 such that the third electrode 232 is interposed between the semiconductor layer 234 and the piezoelectric substrate 202.

In FIG. 2C, the line represented as 236 is illustrated to show the relationship between the different elements, which may include electrical coupling and/or mechanical coupling.

Figure 2D:
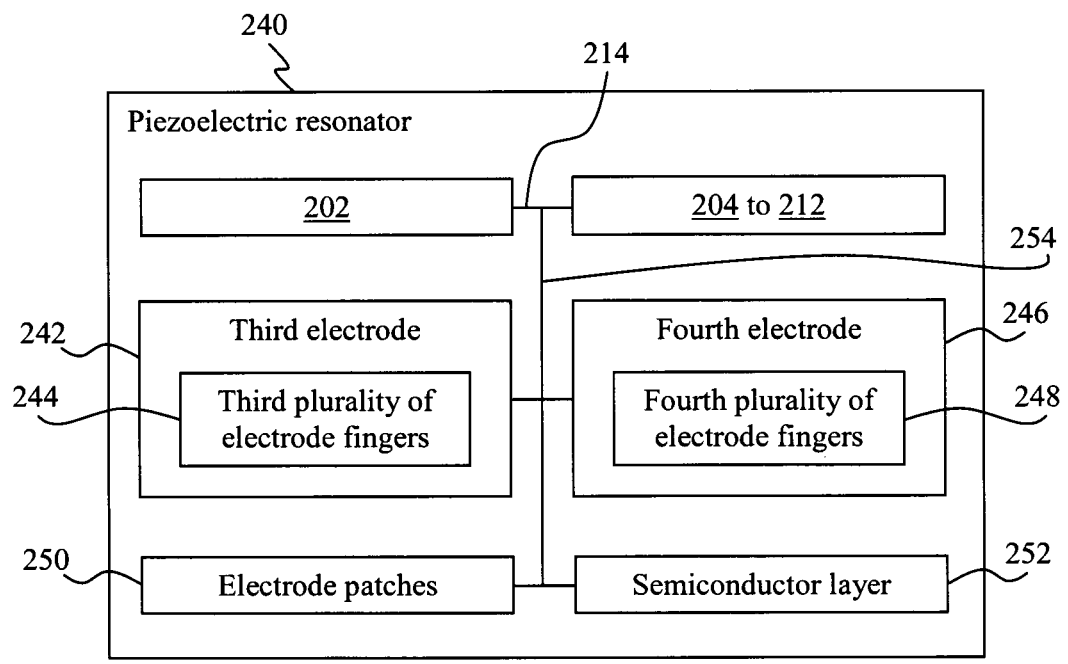

FIG. 2D shows a schematic block diagram of a piezoelectric resonator 240, according to various embodiments. The piezoelectric resonator 240 includes a piezoelectric substrate 202, a first electrode 204, a second electrode 208 and electrode patches 212, which may be similar to the embodiment as described in the context of FIG. 2A.

The piezoelectric resonator 240 may further include a third electrode 242 comprising a third plurality of electrode fingers 244, a fourth electrode 246 comprising a fourth plurality of electrode fingers 248, wherein the third plurality of electrode fingers 244 and the fourth plurality of electrode fingers 248 are interdigitated, wherein electrode patches 250 are arranged along the third plurality of electrode fingers 244 and the fourth plurality of electrode fingers 248 according to the 2-dimensional lattice, and wherein the third electrode 242 and the fourth electrode 246 are disposed over a second surface of the piezoelectric substrate 202.

The electrode patches 250 of the third plurality of electrode fingers 244 may be opposite to the electrode patches 212 of the first plurality of electrode fingers 206 with respect to the piezoelectric substrate 202, and the electrode patches 250 of the fourth plurality of the electrode fingers 248 may be opposite to the electrode patches 212 of the second plurality of electrode fingers 210 with respect to the piezoelectric substrate 202.

The piezoelectric resonator 240 may further include a semiconductor layer 252 such that the third electrode 242 and the fourth electrode 246 are interposed between the semiconductor layer 252 and the piezoelectric substrate 202.

In the context of various embodiments, the piezoelectric substrate 202 may be made of any piezoelectric material that includes but is not limited to aluminum nitride (AlN), zinc oxide (ZnO), or lithium niobate (LiNbO$_3$). The thickness of the piezoelectric substrate may range from several hundreds of nanometers to several micrometers, for example about 100 nm to about 5 μm, e.g. about 500 nm to about 3 μm or about 1 μm to about 2 μm.

In the context of various embodiments, the semiconductor layer (e.g. 222, 234, 252) may be a silicon layer. Any other semiconductor layer with low acoustic loss may also be used. In various embodiments, the thickness of the semiconductor layer may be from several micrometers to tens of micrometers, for example about 1 μm to about 50 μm, e.g. about 5 μm to about 30 μm or about 10 μm to about 20 μm.

In the context of various embodiments, each of the electrode patches (e.g. 212, 250) may be of at least substantially square shape. However, it should be appreciated that other various polygonal shapes, for example triangle, pentagon and hexagon, may be provided as long as the shape does not obstruct the acoustic wave propagations. The electrode patches are arranged in a repeating pattern along the plurality of electrode fingers.

For a square electrode patch, its side length may range from several micrometers to tens of micrometers, for example about 1 μm to about 80 μm, e.g. about 10 μm to about 50 μm or about 20 μm to about 40 μm and its thickness may be in hundreds of nanometers, for example about 100 nm to about 800 nm, e.g. about 200 nm to about 600 nm or about 400 nm to about 500 nm.

In the context of various embodiments, the piezoelectric resonator (e.g. 200, 220, 230, 240) may be of at least substantially square shape. However, it should be appreciated that the piezoelectric resonator (e.g. 200, 220, 230, 240) may have other shapes, for example polygonal shapes such as triangle, pentagon and hexagon. The shape of the piezoelectric resonator (e.g. 200, 220, 230, 240) defines the edge boundary area that confines the standing acoustic waves generated within the piezoelectric resonator (e.g. 200, 220, 230, 240). In various embodiments, the shape of the piezoelectric resonator (e.g. 200, 220, 230, 240) may depend on the shape of the electrode patches (e.g. 212, 250).

In the context of various embodiments, the side length of a square resonator that contains a plurality of the electrode patches may range from tens of micrometers to hundreds of micrometers, for example about 50 μm to about 500 μm, e.g. about 100 μm to about 300 μm or about 150 μm to about 200 μm. The side length of the square resonator may be for example 100 μm, 150 μm or 200 μm.

In the context of various embodiments, each of the first electrode 204, the second electrode 208, the third electrode 232, 242, the fourth electrode 246 and the electrode patches 212, 250, may be made of a metal including but not limited to gold (Au), aluminum (Al), molybdenum (Mo), tungsten (W), platinum (Pt) or titanium (Ti).

In the context of various embodiments, the term "2-dimensional lattice" may mean a lattice extending in two dimensions, e.g. extending in a plane.

In the context of various embodiments, the term "line grid" may mean a pattern of squares formed from a series of horizontal and vertical lines.

In the context of various embodiments, the resonator (e.g. 200, 220, 230, 240) may have a released structure with boundaries. Therefore, while the resonator is coupled to other parts of a wafer, the resonator includes boundaries separated by a gap from the other parts of the wafer. In various embodiments, the resonator (e.g. 200, 220, 230, 240) may be floating, and not in contact with the semiconductor layer (e.g. 222, 234, 252).

In the context of various embodiments, an electrode centre may be defined as a position at least substantially at the middle or central point of each electrode patch.

Figure 3A:
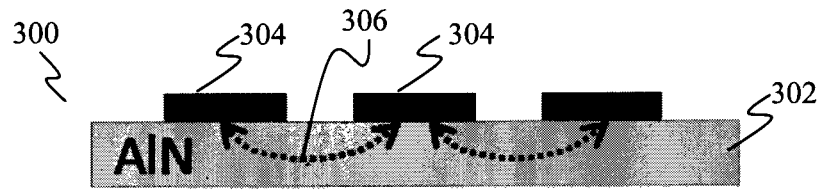
FIGS. 3A to 3C show schematic cross-sectional views of different electrode arrangements, according to various embodiments.
Figure 3B:
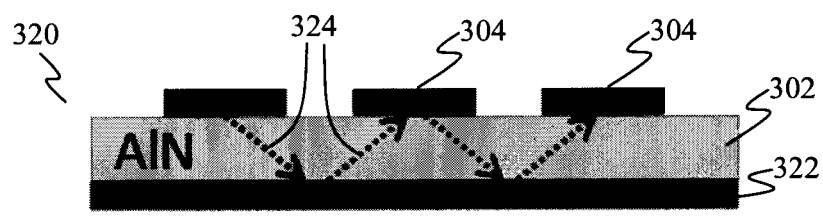
Figure 3C:
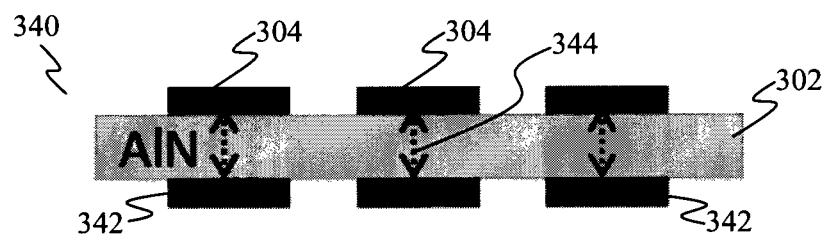

FIGS. 3A to 3C show schematic cross-sectional views of different electrode arrangements, according to various embodiments.

FIG. 3A shows a resonator 300 having a piezoelectric substrate (e.g. AlN) 302 and checker-patterned electrodes 304 over or on a surface (e.g. top surface) of the piezoelectric substrate 302. Therefore, the checker-patterned electrodes 304 are top electrodes. While not clearly shown, the checker-patterned electrodes 304 includes a pair of interdigitated (IDT) electrodes.

For the embodiment illustrated in FIG. 3A, an electric field may be applied across adjacent electrodes of the checker-patterned electrodes 304 to excite the resonator 300 for lateral field excitation (LFE). Therefore, adjacent electrodes of the checker-patterned electrodes 304 have opposite polarity. The dotted arrows, as represented by 306, illustrate the overall path of the electric field due to LFE.

FIG. 3B shows a resonator 320 having a piezoelectric substrate (e.g. AlN) 302, checker-patterned electrodes 304 over or on a surface (e.g. top surface) of the piezoelectric substrate 302 and another electrode 322 over an opposing surface (e.g. bottom surface) of the piezoelectric substrate 302. Therefore, the checker-patterned electrodes 304 are top electrodes while the electrode 322 is a bottom electrode, with the piezoelectric substrate 302 in between. While not clearly shown, the checker-patterned electrodes 304 includes a pair of interdigitated (IDT) electrodes.

The bottom electrode 322 may be a substantially contiguous electrode layer covering at least substantially the bottom surface of the piezoelectric substrate 302. The bottom electrode 322 may be floating or grounded, depending on the design. With this electrode arrangement, the path of the electric fields, as represented by the dotted arrows 324, between the top IDT electrodes (i.e. checker-patterned electrodes 304) pass through the bottom electrode 322 as a conducting medium.

FIG. 3C shows a resonator 340 having a piezoelectric substrate (e.g. AlN) 302, checker-patterned electrodes 304 over or on a surface (e.g. top surface) of the piezoelectric substrate 302 and checker-patterned electrodes 342 over an opposing surface (e.g. bottom surface) of the piezoelectric substrate 302. Therefore, the checker-patterned electrodes 304 are top electrodes while the checker-patterned electrodes 342 are bottom electrodes, with the piezoelectric substrate 302 in between. While not clearly shown, the checker-patterned electrodes 304 and the checker-patterned electrodes 342 include a respective pair of interdigitated (IDT) electrodes. Both the checker-patterned electrodes 304 and the checker-patterned electrodes 342 may have at least substantially similar electrode arrangement or configuration.

For the embodiment illustrated in FIG. 3C, an electric field may be applied across the checker-patterned electrodes 304 and the checker-patterned electrodes 342 to excite the resonator 340 for thickness field excitation (TFE). The dotted arrows, as represented by 344, illustrate the overall path of the electric field due to TFE.

In various embodiments, it may also be possible to excite both LFE and TFE by carefully designing the positive/negative polarity of the plurality of fingers of the top IDT electrodes (i.e. checker-patterned electrodes 304) and that of the plurality of fingers of the bottom IDT electrodes (i.e. checker-patterned electrodes 342), such that lateral and vertical electric fields may be generated at the same time. The opposite polarity of adjacent electrodes of the top IDT electrodes or the bottom IDT electrodes, due to lateral electric fields, may generate LFE, whereas, the opposite polarity between the top IDT electrodes and the bottom IDT electrodes, that are at least substantially directly below the top IDT electrodes, due to vertical electric fields, may generate TFE.

Figure 3D:
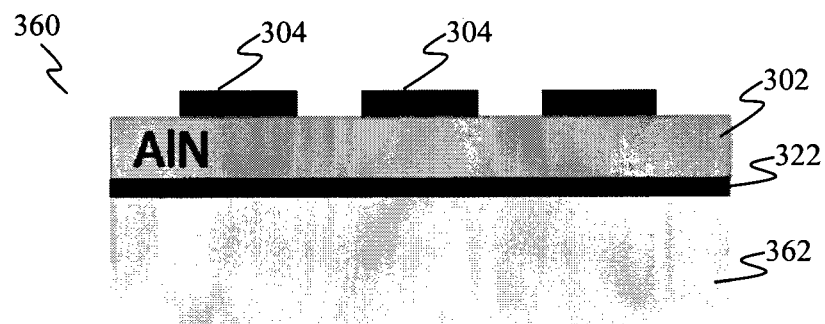
FIG. 3D shows a schematic cross-sectional view of a resonator with a semiconductor layer, according to various embodiments.

FIG. 3D shows a schematic cross-sectional view of a resonator 360 with a semiconductor layer (e.g. single crystal silicon layer/substrate or a silicon-on-insulator (SOI)) 362, according to various embodiments. As shown in FIG. 3D, the electrode arrangement of the resonator 360 is similar to that of the resonator 320 (FIG. 3B). However, it should be appreciated that the semiconductor layer 362 may also be provided to the resonator 300 (FIG. 3A) adjacent the bottom surface of the piezoelectric substrate 302, opposite to the checker-patterned electrodes 304, or to the resonator 340 (FIG. 3C) adjacent the the checker-patterned electrodes 342.

It should be appreciated that the resonators 300, 320, 340, 360, may be configured as asymmetric checker-mode resonators or symmetric checker-mode resonators.

Figure 4A:
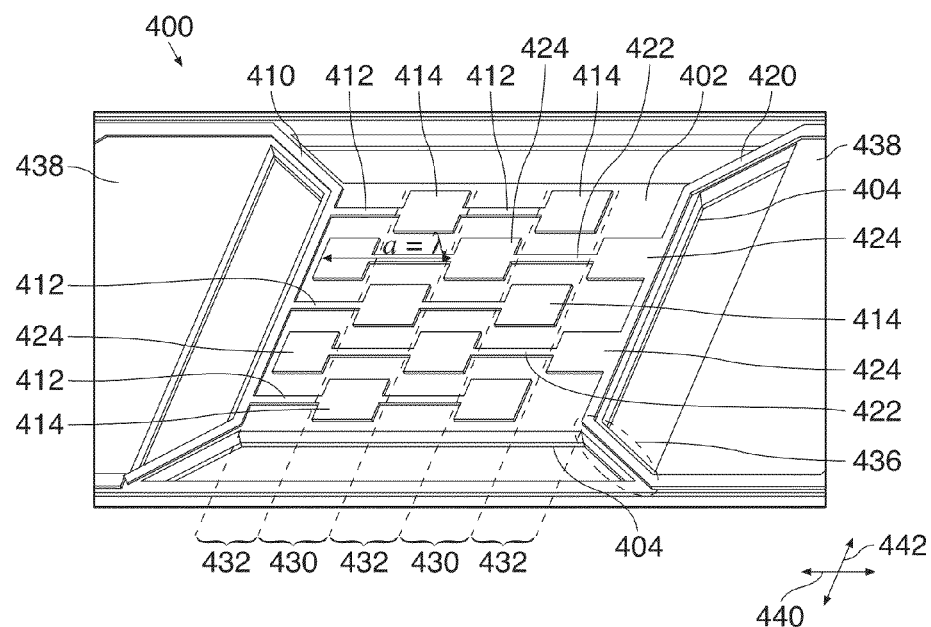
FIG. 4A shows a schematic perspective view of a checker-mode resonator, according to various embodiments.

It should be appreciated that the checker-patterned electrodes 304 of the resonators 300, 320, 340, 360, may be at least substantially similar to that as described in the context of FIG. 4A.

In the context of various embodiments, the silicon substrate 362 is used as a support material beneath the piezoelectric substrate 302. For example, where the silicon substrate 362 is single crystal silicon, the substrate 362 may enhance the quality factor of the checker-mode resonator 360, as the acoustic damping of AlN piezoelectric material is higher than that of the single crystal silicon.

In various embodiments, the additional thickness of the silicon substrate 362 may increase the resonant frequency of asymmetric checker-mode resonators. However, for symmetric checker-mode resonators, the silicon substrate 362 may not change the resonant frequency significantly, and the resonant vibrations are similar to that of the extensional mode or contour mode type.

FIG. 4A shows a schematic perspective view of a checker-mode resonator 400, according to various embodiments. The checker-mode resonator 400 has a square shape. The shape of the resonator 400 defines the edge boundary area that confines the standing acoustic waves generated within the resonator 400.

The checker-mode resonator 400 includes an aluminum nitride (AlN) layer or substrate 402 in between top checker-patterned electrodes and a bottom electrode 404. While not clearly shown, the bottom electrode 404 is a contiguous electrode layer covering the bottom surface of the AlN substrate 402, and may be floating or grounded, depending on the design.

The top checker-patterned electrodes on the top surface of the AlN substrate 402 include a pair of interdigitated electrodes, e.g. a first electrode 410 having a first plurality of electrode fingers 412 and a second electrode 420 having a second plurality of electrode fingers 422, where the first plurality of electrode fingers 412 and the second plurality of electrode fingers 422 are interdigitated. The first plurality of electrode fingers 412 and the second plurality of electrode fingers 422 may be at least substantially equally spaced from each other. The first plurality of electrode fingers 412 and the second plurality of electrode fingers 422 extend along a dimension 440.

The first electrode 410 may be a drive electrode biased by an AC voltage source while the second electrode 420 may be a sense electrode for sensing, not biased to a voltage source.

The checker-mode resonator 400 also includes electrode patches 414 arranged along the first plurality of electrode fingers 412 and electrode patches 424 arranged along the second plurality of electrode fingers 422, according to a 2-dimensional lattice. Each of the electrode patches 414, 424, is of at least substantially square shape.

The distance or pitch, a, between adjacent electrode patches 414, 424, of a particular electrode finger determines the resonant frequency of the resonator 400, and is equal to the wavelength, λ, related to the resonant frequency.

The electrode patches 414, 424, are arranged according to a line grid having a first plurality of lines 430 and a second plurality of lines 432 extending along a dimension 442, that is perpendicular to the dimension 440. The first plurality of lines 430 and the second plurality of lines 432 are arranged in an alternating manner along the dimension 440. In addition, the lines of the first plurality of lines 430 and the second plurality of lines 432 are at least substantially equally spaced along the dimension 440.

As shown in FIG. 4A, the electrode patches 414 arranged along the first plurality of electrode fingers 412 are arranged along the first plurality of lines 430, and the electrode patches 424 arranged along the second plurality of electrode fingers 422 are arranged along the second plurality of lines 432.

Anchors or anchor beams, as represented by 436 for one anchor, for the resonator 400 may be placed at four corners of the AlN substrate 402 (FIG. 4A) or at any location along the side length (e.g. at the middle of the side length), depending on the thickness of the AlN substrate 402.

As shown in FIG. 4A, the checker-mode resonator 400 has a released structure, with boundaries, and coupled by the anchors 436 to other parts 438 of the wafer.

It should be appreciated that while FIG. 4A shows that the checker-mode resonator 400 has a square shape, it should be appreciated that the checker-mode resonator 400 may have other polygonal shapes, for example triangle, pentagon or hexagon, depending on the polygonal shapes of the individual electrode patches 414, 424.

It should be appreciated that while FIG. 4A shows the resonator 400 having four anchors 436, any number of the anchors 436 may be provided, for example, two, three or five anchors.

It should be appreciated that while FIG. 4A shows the resonator 400 having three electrode fingers 412 and two electrode fingers 422, any number of the electrode fingers 412, 422, may be provided.

It should be appreciated that while FIG. 4A shows that two electrode patches 414 are arranged along each electrode finger 412 and three electrode patches 424 are arranged along each electrode finger 422, for a total number of 12 electrode patches 414, 424, any number of the electrode patches 414, 424, may be provided. Similarly, it follows that the first plurality of lines 430 and the second plurality of lines 432 may have any number of lines.

The checker-mode resonator 400 with the top checker-patterned electrodes may simultaneously excite two intersecting acoustic waves (e.g. asymmetric or symmetric Lamb waves), for example one wave travelling or propagating in a direction along the dimension 440 and the other wave travelling or propagating in a direction along the dimension 442. The two intersecting waves propagate in perpendicular directions due to the square shape of the resonator 400 and the electrode patches 414, 424.

The acoustic waves vibrate in a standing wave, propagating back and forth along the perpendicular directions, due to the "edge" boundary conditions for the released square resonator structure 400.

It should be appreciated that the bottom electrode 404 may not be present or may be patterned similarly to the top checker-patterned electrodes. Where the bottom electrode 404 is patterned similar to the top checker-patterned electrodes, thereby having a pair of interdigitated electrodes, the bottom pair of interdigitated electrodes may be biased to ground.

Alternatively, one electrode (e.g. 410) of the top pair of interdigitated electrodes may be biased with a positive AC voltage and one electrode of the bottom pair of interdigitated electrodes may be biased with a negative AC voltage, while the remaining electrodes of the respective top and bottom pairs of interdigitated electrodes are configured as sense electrodes with positive or negative polarity. Such an electrical configuration provides a "differential" drive/sense, as the positive AC source is 180 degrees out of phase with the negative AC source while the voltage amplitude is the same.

Figures 4B, 4C:
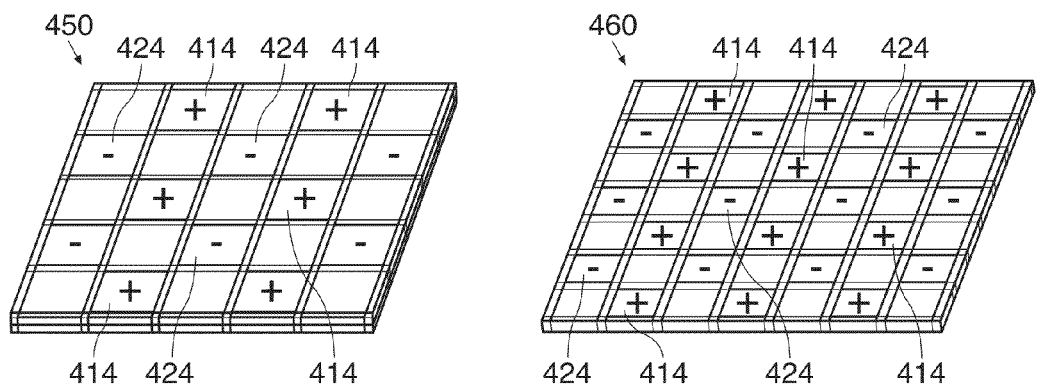
FIGS. 4B and 4C show schematic perspective views of different electrode configurations, according to various embodiments.

FIGS. 4B and 4C show schematic perspective views of different electrode configurations, according to various embodiments. FIG. 4B shows an electrode configuration 450 of 12 electrode patches 414, 424, while FIG. 4C shows an electrode configuration 460 of 24 electrode patches 414, 424. The signs "+" and "−" shown in FIGS. 4B and 4C illustrate the polarities of the electric field applied to the electrode patches 414, 424. However, it should be appreciated that the polarities may be reversed. The signs "+" and "−" may also illustrate the relative polarity among the electrode patches 414, 424, and not necessarily the absolute polarities.

In addition, it should be appreciated that other electrode configurations and number of electrode patches 414, 424, may be possible to form the checker pattern, for example 4, 7, 8, 10, 17, 40 electrode patches. The impedance level of the resonator 400 is dependent on the number of the electrode patches 414, 424, and therefore, this number may be changed to vary the impedance.

The resonant frequency of the checker-mode resonator 400 is dependent on the size of the electrode patches 414, 424, and/or the distance, a, between the electrode patches 414, 424, and at least one of these parameters may be varied to vary the resonant frequency. Therefore, resonators with multiple frequencies may be fabricated on a single wafer.

Figure 5A:
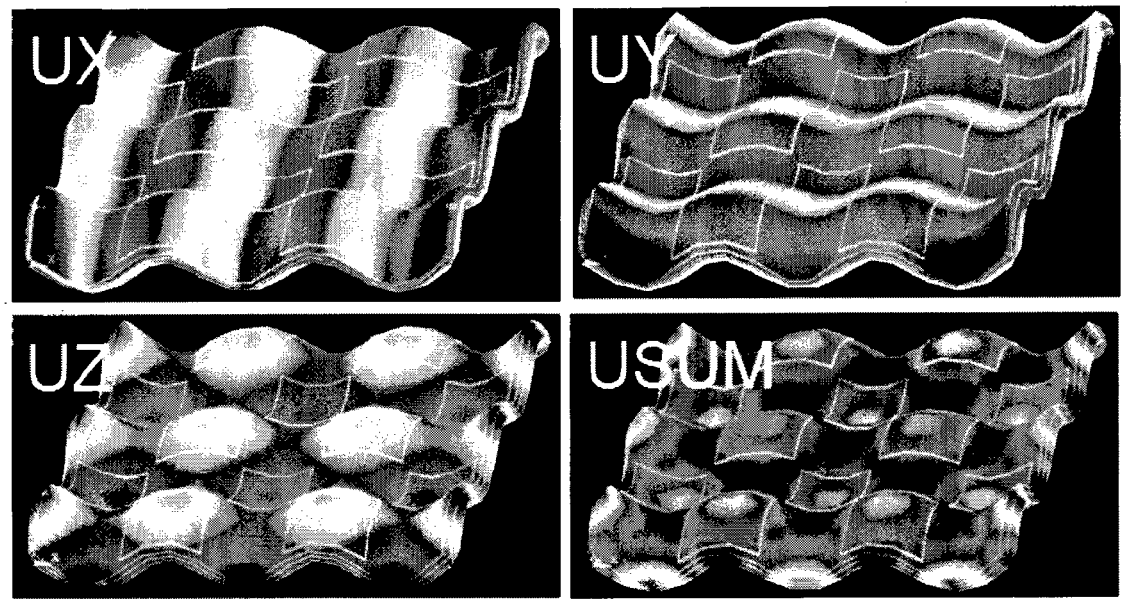
FIGS. 5A and 5B show finite element method (FEM) simulations of asymmetric and symmetric resonant vibrations respectively of checker-mode resonators, according to various embodiments.
Figure 5B:
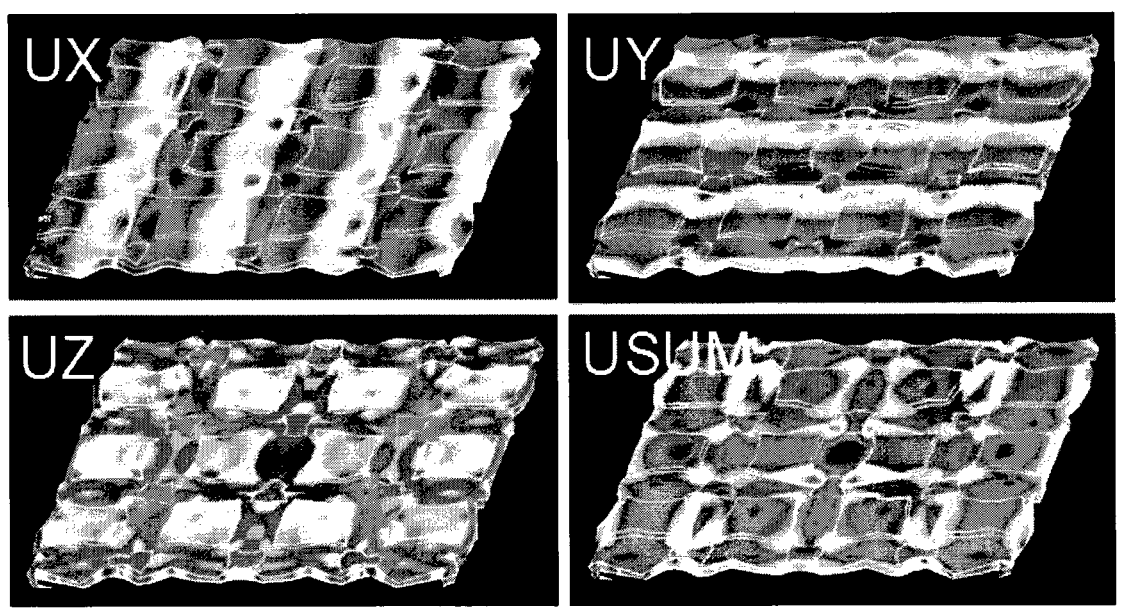

FIGS. 5A and 5B show finite element method (FEM) simulations of asymmetric and symmetric resonant vibrations respectively of checker-mode resonators, according to various embodiments, illustrating displacement of the resonant vibrations. The asymmetric checker-mode has out-of-plane flexural vibrations at resonance while the symmetric checker-mode vibrates in-plane at resonance. The terms "UX", "UY", "UZ", and "USUM" in FIGS. 5A and 5B refer to the displacement along the X direction, the displacement along the Y direction, the displacement along the Z direction, and the overall displacement sum, respectively.

The thickness of the resonator has more effect on the resonant frequency of the asymmetric mode compared to that of the symmetric mode. The acoustic phase velocity of the symmetric mode is higher, about slightly more than twice, compared to that of the asymmetric mode.

FIGS. 6A to 6D show an example process flow 600 of fabricating a checker-mode resonator, according to various embodiments. Fabrication may be carried out in a 4-mask process, or in a 5-mask process if an oxide layer below the bottom electrode is included in the process flow. The fabrication process is a top-down approach where the bottom electrode is deposited fully on an entire wafer without etching, before the subsequent deposition of AlN, in order to ensure a good (002) crystal orientation of AlN thin film.

An an example and not limitation, the fabrication process is described for a resonator on an SOI substrate, where the resonator includes an AlN piezoelectric substrate sandwiched between a checker-patterned top Al electrode and a contiguous bottom Al electrode layer.

Figure 6A:
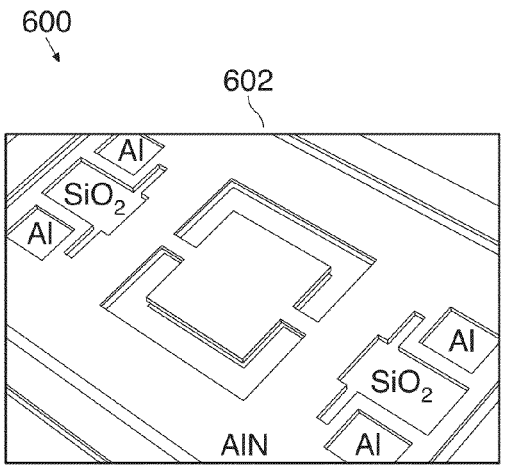
FIGS. 6A to 6D show a process of fabricating a checker-mode resonator, according to various embodiments.

FIG. 6A shows the structure 602 formed, after an AlN etch based on an oxide hardmask.

Figure 6B:
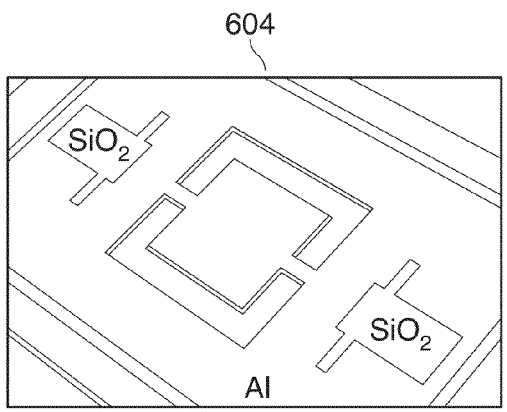

FIG. 6B shows the structure 604 formed, after etching of the bottom Al electrode using a second mask. For clarity and easier understanding, the AlN substrate or layer over the bottom Al electrode is not shown.

Figure 6C:
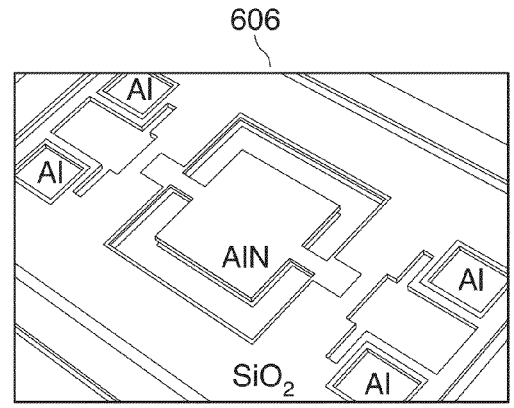

FIG. 6C shows the structure 606 formed, after patterning and etching of the $SiO_2$ layer using a third mask, for isolation of the resonator formed in the subsequent process.

Figure 6D:
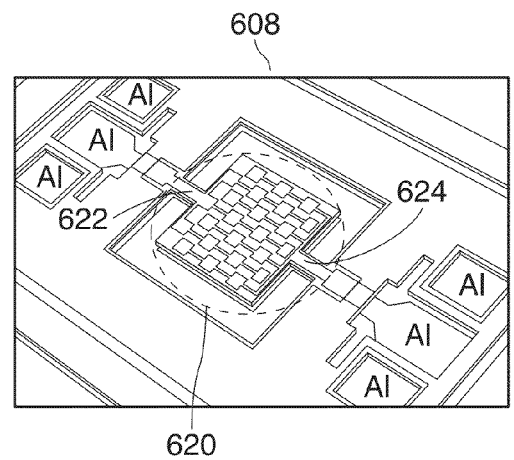

FIG. 6D shows the structure 608 formed, after patterning and etching of the checker-patterned top Al electrode to form the resonator 620. As shown in FIG. 6D, the resonator 620 includes a pair of interdigitated electrodes 622, 624, each electrode having a plurality of electrode fingers, and electrode patches arranged along each electrode finger.

The resonator 620 has a square shape, with two anchors or anchor beams placed on opposite sides and in the middle of the side length.

Various embodiments of the checker-mode resonators have been described with aluminum nitride (AlN) as the piezoelectric material of the piezoelectric substrate due to its compatibility with CMOS circuits and relative ease of deposition and etching. However, it should be appreciated that other piezoelectric materials or crystalline piezoelectric materials such as zinc oxide (ZnO) or lithium niobate ($LiNbO_3$) may also be employed.

Figure 7:
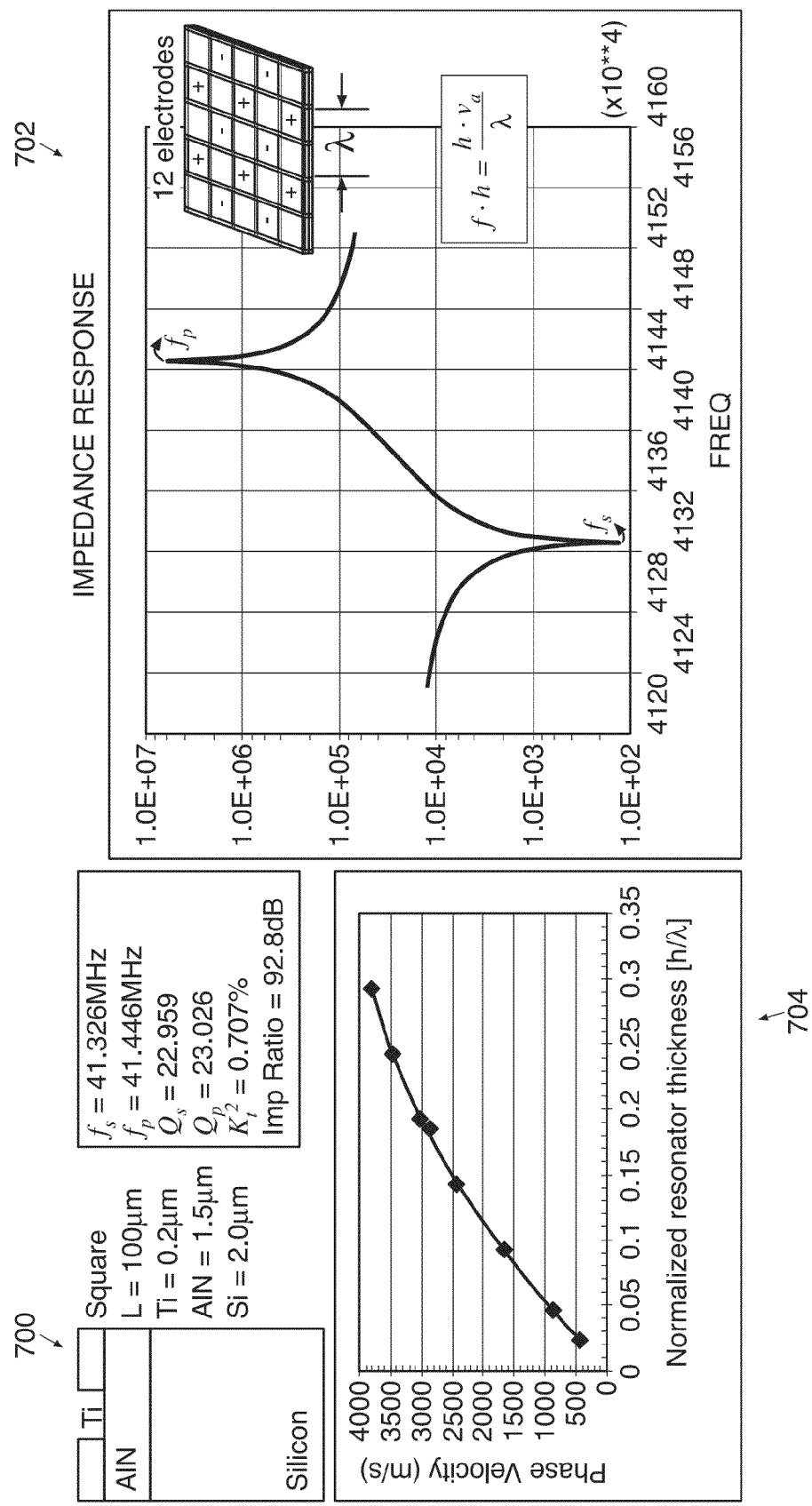
FIG. 7 shows an asymmetric checker-mode resonator and its corresponding simulated impedance response.

FIG. 7 shows an asymmetric checker-mode resonator 700 and its corresponding simulated impedance response 702. The impedance response 702 was simulated with ANSYS.

The resonator 700 has a square shape with a side length, L, of about 100 μm. As shown in FIG. 7, the resonator 700 includes an AlN substrate (thickness of about 1.5 μm) on a silicon substrate (thickness of about 2 μm). The resonator 700 includes checker-patterned top electrodes of titanium (Ti) with 12 electrode patches (thickness of each electrode patch of about 0.2 μm).

As shown in the plot 704, the phase velocity or acoustic phase velocity of asymmetric checker mode depends on the ratio of the plate thickness to wavelength (h/λ), i.e. the phase velocity changes with the normalized plate thickness (h/λ) and is a property of the asymmetric checker mode, similar to that of the lowest asymmetric Lamb mode. Therefore, changes in the total thickness of the resonator 700 leads to a shift in the resonant frequency, which is characteristic of asymmetric Lamb waves.

As shown in the impedance response 702, the resonant frequencies, $f_s$, is about 41.326 MHz and $f_p$ is about 41.446 MHz. The quality factors, $Q_s$ at $f_s$ is about 22959 and $Q_p$ at $f_p$ is about 23026. The coupling coefficient, $K_t^2$, is about 0.707% while the impedance ratio (imp ratio) is about 92.8 dB.

The equation $fh=hv_a/\lambda$ shown in FIG. 7 illustrates the relationship between the phase velocity, $v_a$, and the ratio of the thickness to wavelength (h/λ).

Figure 8:
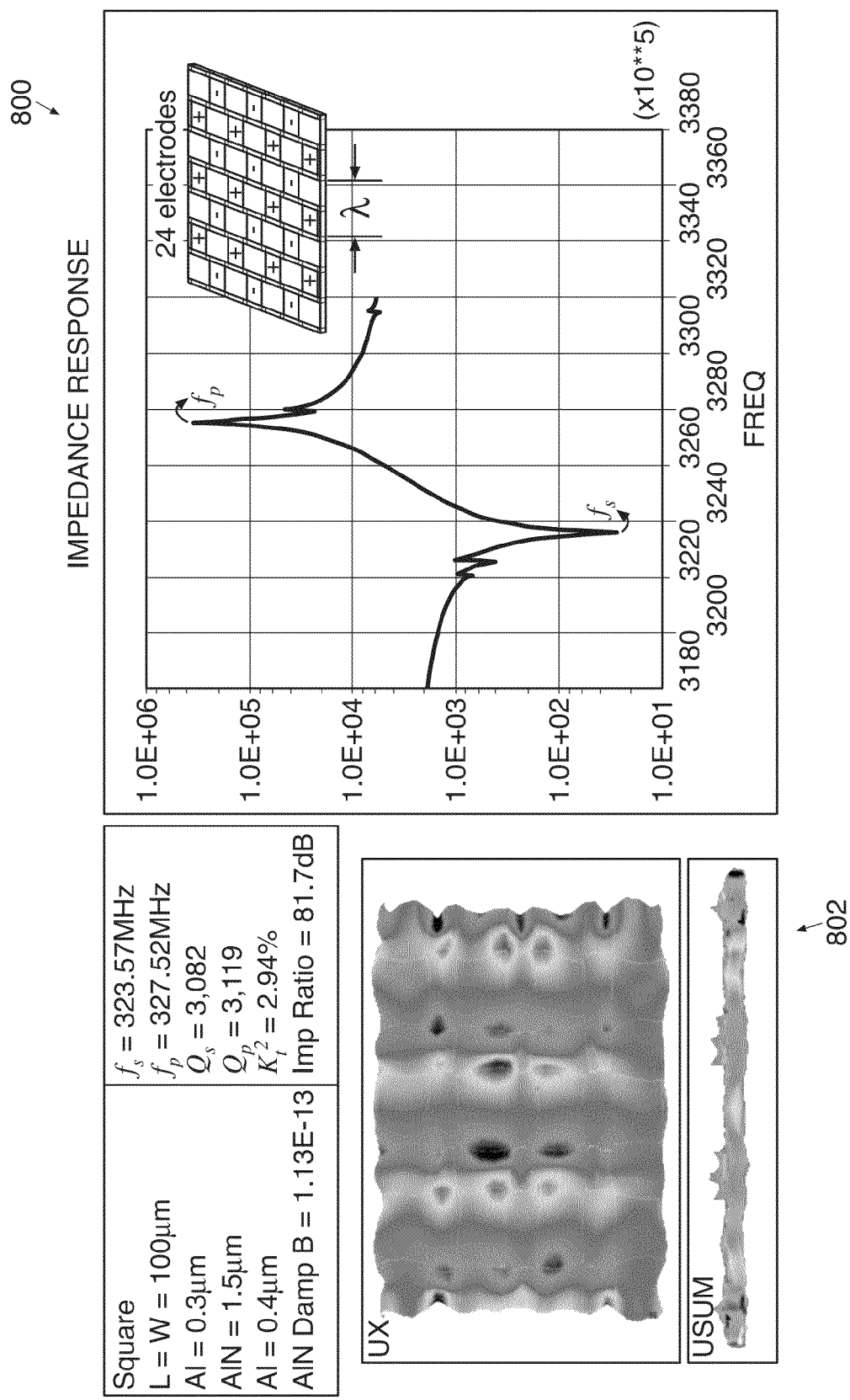
FIG. 8 shows simulated impedance response and resonant vibrations of a symmetric checker-mode resonator.

FIG. 8 shows simulated impedance response 800 and resonant vibrations 802 of a symmetric checker-mode resonator. The impedance response 800 was simulated with ANSYS while the resonant vibrations 802 were simulated via FEM.

The symmetric checker-mode resonator used for the simulations obtained in FIG. 8 has a square shape with a side length of about 100 μm. The resonator has a thin film device structure of a [Al—AlN—Al] stack with displacement boundary conditions at the four corners. The resonator includes an AlN substrate (thickness of about 1.5 μm), checker-patterned top aluminum (Al) electrodes with 24 electrode patches (thickness of each electrode patch of about 0.3

μm) and an unpatterned contiguous bottom electrode layer (thickness of about 0.4 μm) which is fully grounded.

As shown in the impedance response 800, the resonant frequencies, $f_s$, is about 323.57 MHz and $f_p$ is about 327.52 MHz. The quality factors, $Q_s$ at $f_s$ is about 3082 and $Q_p$ at $f_p$ is about 3119. The coupling coefficient, $K_t^2$, is about 2.94% while the impedance ratio (imp ratio) is about 81.7 dB.

With a coupling coefficient of about 2.94%, multiple symmetric checker-mode resonators may be cascaded to form a band-pass filter.

Measurement results of the checker-mode resonators of various embodiments will now be described by way of examples. Measurement of checker-mode resonators in two-port arrangement was carried out for the S21 frequency response.

Figure 9A:
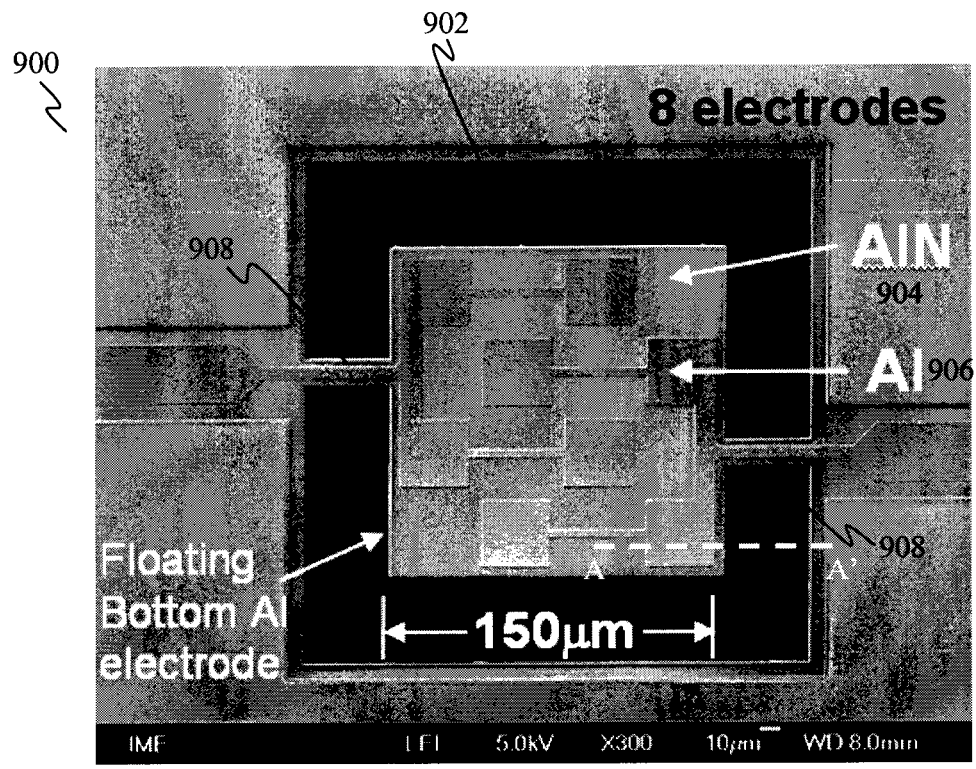
FIG. 9A shows a scanning electron microscopy (SEM) image of a top view of a symmetric checker-mode resonator, according to various embodiments. The scale bar represents 10 μm.

FIG. 9A shows a scanning electron microscopy (SEM) image 900 of a top view of a symmetric checker-mode resonator 902, according to various embodiments.

The symmetric checker-mode resonator 902 has a structure of [Al—AlN—Al], including a bottom Al electrode of a thickness of about 0.4 μm, an AlN piezoelectric substrate 904 of a thickness of about 1.0 μm and top checker-patterned Al electrodes 906 of a thickness of about 0.3 μm, over a thermally oxidised silicon dioxide of a thickness of about 0.5 μm, where all the layers are deposited on top of a bulk silicon substrate. The bottom Al electrode is a floating electrode. The resonator 902 has a square shape with a side length of about 150 μm with two anchors 908, as shown in the SEM image 900. The two anchors 908 are placed on opposite sides and offset from the middle of the side length, where each anchor 908 has a width of about 17 μm. The top checker-patterned electrodes 906 are defined by a pair of electrodes with interdigitated electrode fingers and 8 square electrode patches with a side length of about 32 μm arranged along the electrode fingers, as shown in the SEM image 900.

Figure 9B:
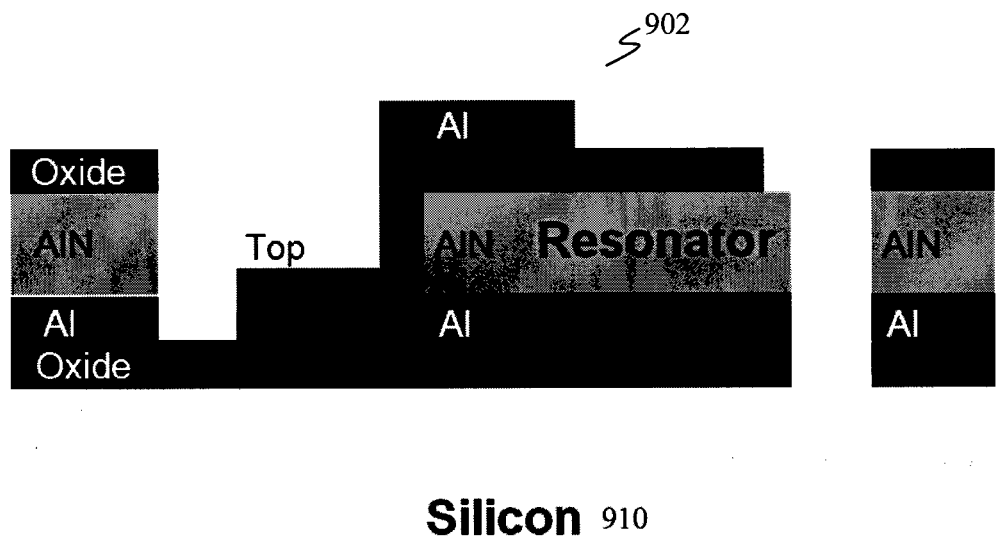
FIG. 9B shows a schematic cross-sectional view of the embodiment of FIG. 9A.

FIG. 9B shows a schematic cross-sectional view of the embodiment of FIG. 9A, along the dotted line A-A'. As shown in FIG. 9B, the resonator 902 is floating (also termed as "released") above the substrate 910, i.e. the resonator 902 is not in contact with the silicon substrate 910. The released resonator enables it to vibrate freely at its resonant frequency.

Figure 9C:
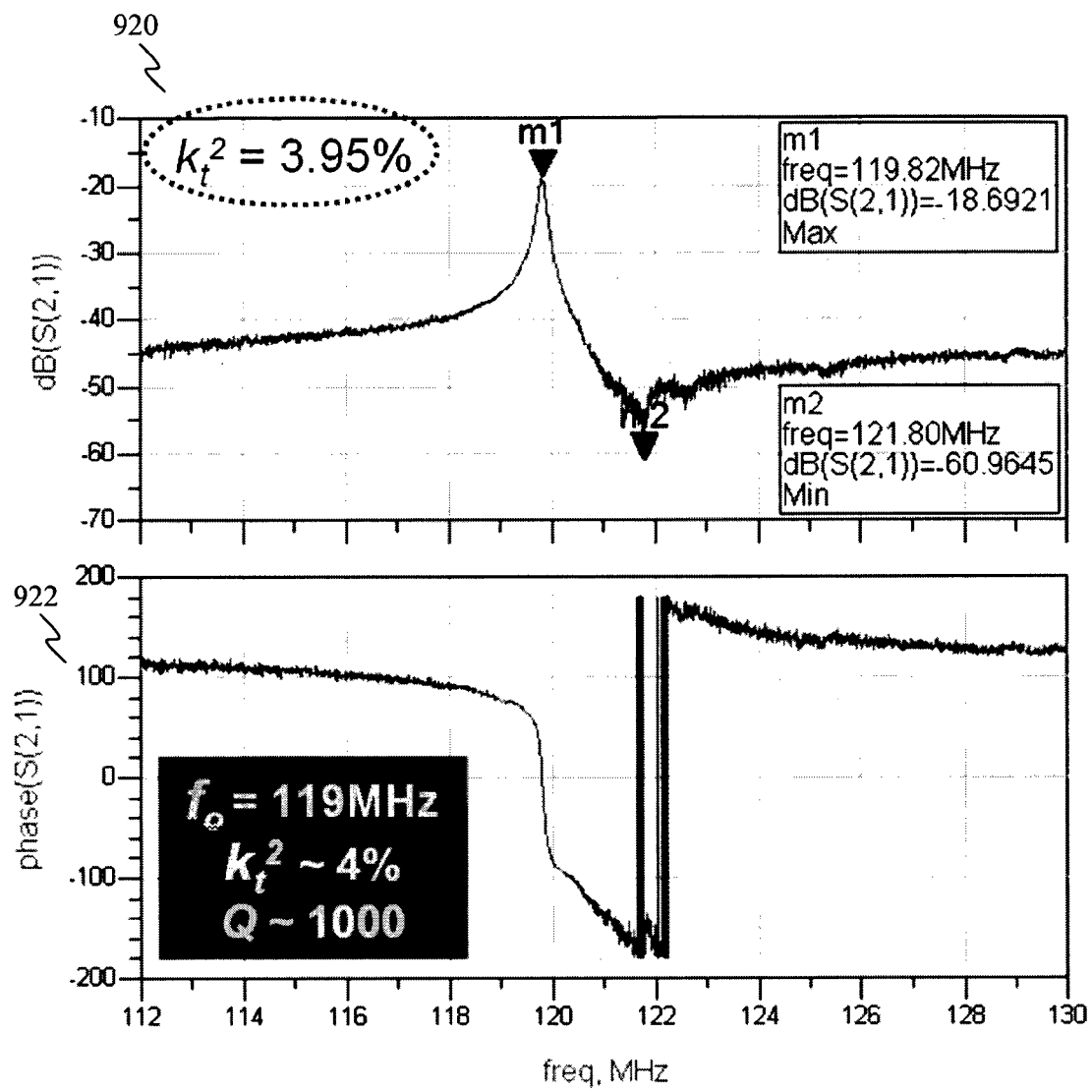
FIG. 9C shows the measured S21 response of the embodiment of FIG. 9A.

FIG. 9C shows the measured S21 response of the embodiment of FIG. 9A. The S21 response includes the S21 transmission plot 920, illustrating the S21 transmission after de-embedding, and the S21 phase plot 922. The S21 response was measured with a 2-port setup with a Network Analyzer (E8364B).

The measured resonant frequency is about 119.82 MHz, as indicated as "m1" in the S21 transmission plot 920, with a clear phase transition at resonance, as shown in the S21 phase plot 922. The resonance is based on symmetric checker-mode. The quality factor, measured in air, based on the 3-dB method from the S21 response is about 1000. The frequency-quality factor (f-Q) product of the checker-mode resonator is approximately $1.2 \times 10^{11}$. The coupling coefficient, $K_t^2$, is about 4%.

Figure 10:
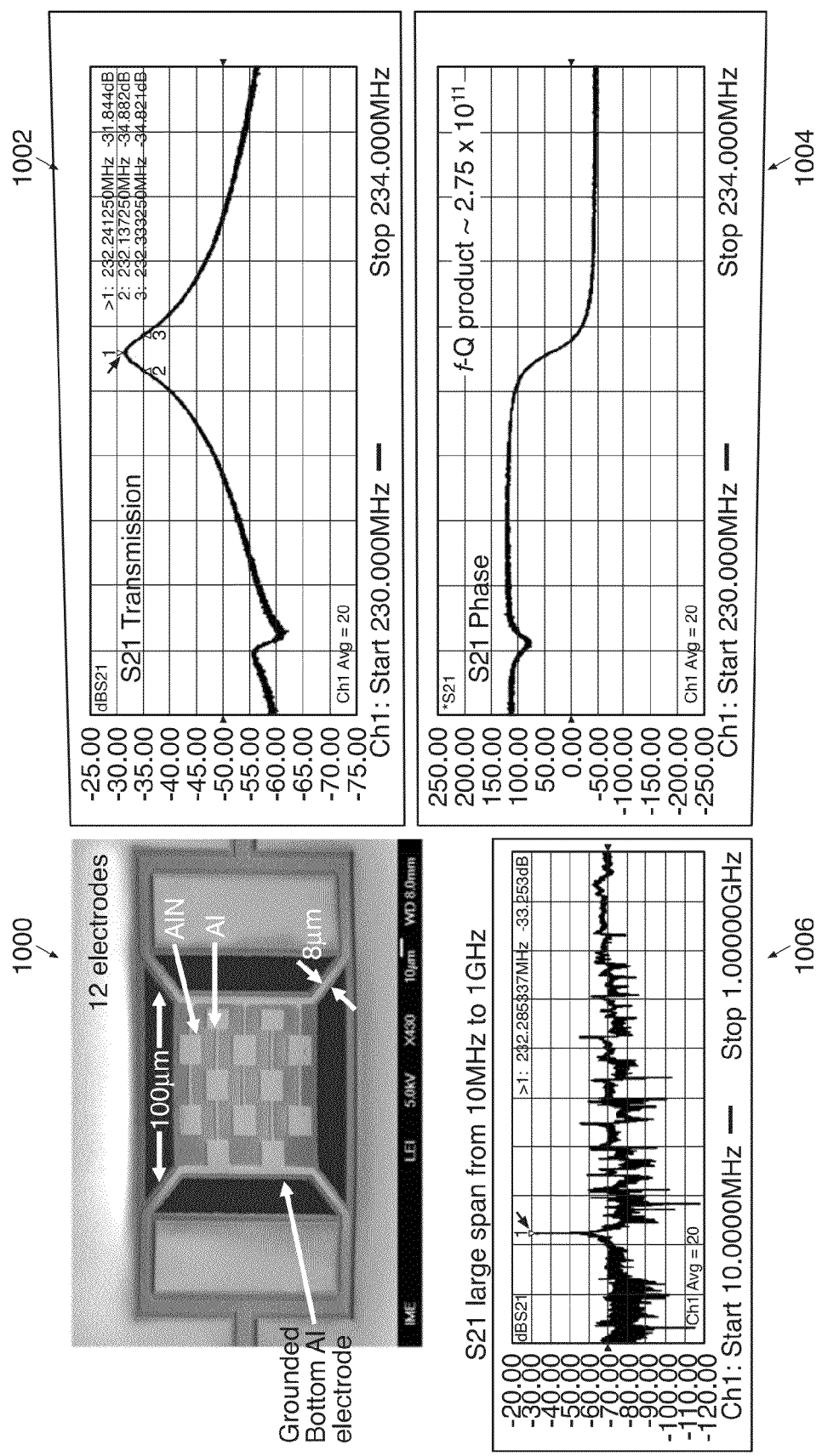
FIG. 10 shows a scanning electron microscopy (SEM) image of a top view of a symmetric checker-mode resonator and its corresponding measured S21 response, according to various embodiments. The scale bar in the SEM image represents 10 μm.

FIG. 10 shows a scanning electron microscopy (SEM) image 1000 of a top view of a symmetric checker-mode resonator and its corresponding measured S21 response, according to various embodiments. The S21 response includes the S21 transmission plot 1002, the S21 phase plot 1004 and the S21 large span plot 1006 from about 10 MHz to about 1 GHz. The S21 response was measured with a 2-port setup with a Network Analyzer (E8364B).

The symmetric checker-mode resonator has a structure of [Al—AN—Al], including a bottom Al electrode of a thickness of about 0.4 μm, an MN piezoelectric substrate of a thickness of about 1.0 μm and top checker-patterned Al electrodes of a thickness of about 0.3 μm, over a thermally oxidised silicon dioxide of a thickness of about 0.5 μm, where all the layers are deposited on top of a bulk silicon substrate. The bottom Al electrode is a grounded electrode. The resonator has a square shape with a side length of about 100 μm with four anchors placed at the corners, each anchor having a width of about 8 μm. The top checker-patterned electrodes are defined by a pair of electrodes with interdigitated electrode fingers and 12 square electrode patches with a side length of about 16 μm arranged along the electrode fingers, as shown in the SEM image 1000.

The measured resonant frequency is about 232.2 MHz, as indicated with a respective arrow in the S21 transmission plot 1002 and the S21 large span plot 1006, with a clear phase transition at resonance, as shown in the S21 phase plot 1004. The resonance is based on symmetric checker-mode. The quality factor, measured in air, based on the 3-dB method from the S21 response is about 1185. The frequency-quality factor (f-Q) product of the checker-mode resonator is approximately $2.75 \times 10^{11}$.

As shown in the S21 large span plot 1006, the checker-mode is the dominant response over a large frequency span from about 10 MHz to about 1 GHz.

Various embodiments may allow the fabrication of multiple resonators on a single wafer, with each resonator having a particular resonant frequency, by varying the size or pitch of the electrode patches along the interdigitated electrode fingers. Therefore, resonators with multiple resonant frequencies may be fabricated on a single wafer.

In addition, the resonant frequency of the resonator may be changed by providing the piezoelectric substrate on a support substrate and varying the thickness of the bottom support substrate. The support substrate includes low-acoustic-loss material such as single crystal silicon, which may improve the quality factor of the resonator. Therefore, high-Q checker-mode resonators on SOI substrates may be provided for operation in the frequency range of MHz to GHz, for example for low phase noise oscillators.

Also, as the excitation may be highly specific with an optimized anchor design, other spurious modes may be minimised or suppressed. Furthermore, the sensing signal level and/or the motional resistance may be improved by increasing the number of checker-patterned electrodes in arrays.

Moreover, the resonators of various embodiments have an improved coupling coefficient, $K_t^2$, thereby enabling the development of RF filters, e.g. an RF front-end band-pass filter. Multiple symmetric checker-mode resonators may be cascaded to form a band-pass filter. A higher coupling coefficient results in a larger bandwidth, a lower insertion loss (IL), and an improved stop-band rejection. Therefore, various embodiments may provide CMOS-compatible piezoelectric resonators with high coupling coefficients for filter applications.

Furthermore, the resonators of various embodiments may be employed as local oscillators in RF systems, for example as high quality factor (high-Q) oscillators with more specific resonant mode.

Moreover, the resonators of various embodiments may be employed as mass sensors and biosensors.

Various embodiments of the resonators advantageously require low power and no DC bias, as compared to capacitive resonators, and require no vacuum packaging.

In various embodiments, suitable resonator design and improved fabrication process may lead to an improvement in the f-Q product of the resonators of various embodiments. For the resonators of various embodiments, having thin piezoelectric films with a large side length (e.g. large square length) to thickness ratio, placement of the anchors or anchor beams and the residual stress of the piezoelectric film may affect the performance of resonator. Large residual stress may cause the resonator or device to become warped (e.g. curved upwardly or downwardly), leading to a reduction in the quality factor. Therefore, suitable design may be provided to reduce the residual stress and anchor losses, thereby providing improved quality factor for various applications, including oscillator applications.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A piezoelectric resonator, comprising:
   a piezoelectric substrate;
   a first electrode comprising a first plurality of electrode fingers;
   a second electrode comprising a second plurality of electrode fingers, wherein the first electrode and the second electrode are disposed over a first surface of the piezoelectric substrate;
   a third electrode comprising a third plurality of electrode fingers;
   a fourth electrode comprising a fourth plurality of electrode fingers, wherein the third electrode and the fourth electrode are disposed over a second surface of the piezoelectric substrate;
   wherein the first plurality of electrode fingers and the second plurality of electrode fingers are interdigitated;
   wherein the third plurality of electrode fingers and the fourth plurality of electrode fingers are interdigitated;
   wherein electrode patches are arranged along the first plurality of electrode fingers and the second plurality of electrode fingers according to a two-dimensional lattice;
   wherein electrode patches are arranged along the third plurality of electrode fingers and the fourth plurality of electrode fingers according to the two-dimensional lattice; and
   wherein the first plurality of electrode fingers and the second plurality of electrode fingers are arranged parallel to the third plurality of electrode fingers and the fourth plurality of electrode fingers.

2. The piezoelectric resonator according to claim 1, wherein the electrode patches arranged along the first plurality of electrode fingers and the second plurality of electrode fingers are arranged according to a line grid which comprises a first plurality of lines and a second plurality of lines, the first plurality of lines and the second plurality of lines extending along a first dimension.

3. The piezoelectric resonator according to claim 2, wherein the electrode patches arranged along the first plurality of electrode fingers are arranged along the first plurality of lines, and the electrode patches arranged along the second plurality of electrode fingers are arranged along the second plurality of lines.

4. The piezoelectric resonator according to claim 2, wherein the first plurality of electrode fingers and the second plurality of electrode fingers extend along a second dimension that is perpendicular to the first dimension.

5. The piezoelectric resonator according to claim 4, wherein the first plurality of lines and the second plurality of lines are arranged in an alternating manner along the second dimension.

6. The piezoelectric resonator according to claim 4, wherein the lines of the first plurality of lines and the second plurality of lines are at least substantially equally spaced along the second dimension.

7. The piezoelectric resonator according to claim 1, wherein the electrode patches of the third plurality of electrode fingers are opposite to the electrode patches of the first plurality of electrode fingers with respect to the piezoelectric substrate, and the electrode patches of the fourth plurality of the electrode fingers are opposite to the electrode patches of the second plurality of electrode fingers with respect to the piezoelectric substrate.

8. The piezoelectric resonator according to claim 1, further comprising a semiconductor layer such that the third electrode and the fourth electrode are interposed between the semiconductor layer and the piezoelectric substrate.

9. The piezoelectric resonator according to claim 8, wherein the semiconductor layer is a silicon layer.

10. The piezoelectric resonator according to claim 1, wherein the piezoelectric substrate is made of any piezoelectric material that includes aluminum nitride (A1N), zinc oxide (ZnO), or lithium niobate (LiNbO$_3$).

11. The piezoelectric resonator according to claim 1, wherein each of the electrode patches is of at least substantially square shape.

12. A piezoelectric resonator, comprising:
    a piezoelectric substrate;
    a first electrode comprising a first plurality of electrode fingers;
    a second electrode comprising a second plurality of electrode fingers, wherein the first electrode and the second electrode are disposed over a first surface of the piezoelectric substrate; and
    a third electrode disposed over a second surface of the piezoelectric substrate, wherein the third electrode is a contiguous electrode layer covering the second surface of the piezoelectric substrate,
    wherein the first plurality of electrode fingers and the second plurality of electrode fingers are interdigitated, and
    wherein electrode patches are arranged along the first plurality of electrode fingers and the second plurality of electrode fingers according to a two-dimensional lattice.

13. The piezoelectric resonator according to claim 12, further comprising a semiconductor layer such that the third electrode is interposed between the semiconductor layer and the piezoelectric substrate.

14. The piezoelectric resonator according to claim 13, wherein the semiconductor layer is a silicon layer.

15. The piezoelectric resonator according to claim 12, wherein the third electrode is adapted to be connected to a ground potential or a floating potential.

* * * * *